United States Patent
Chang

(10) Patent No.: US 10,686,559 B2
(45) Date of Patent: Jun. 16, 2020

(54) DEVICE FOR VERIFYING DATA TRANSMISSIONS AND METHOD USING THE SAME

(71) Applicant: HONGFUJIN PRECISION ELECTRONICS (TIANJIN) CO.,LTD., Tianjin (CN)

(72) Inventor: Yi-Ming Chang, New Taipei (TW)

(73) Assignee: HONGFUJIN PRECISION ELECTRONICS (TIANJIN) CO.,LTD., Tianjin (CN)

( * ) Notice: Subject to any disclaimer, the term of this patent is extended or adjusted under 35 U.S.C. 154(b) by 58 days.

(21) Appl. No.: 16/161,652

(22) Filed: Oct. 16, 2018

(65) Prior Publication Data

US 2020/0028620 A1   Jan. 23, 2020

(30) Foreign Application Priority Data

Jul. 20, 2018   (CN) .......................... 2018 1 0804320

(51) Int. Cl.
  *H03M 13/00*   (2006.01)
  *H04L 1/00*   (2006.01)
  *G06F 11/10*   (2006.01)
  *H03M 13/09*   (2006.01)

(52) U.S. Cl.
  CPC ........ *H04L 1/0063* (2013.01); *G06F 11/1004* (2013.01); *H03M 13/098* (2013.01); *H04L 1/0045* (2013.01)

(58) Field of Classification Search
  CPC .. H04L 1/0063; H04L 1/0045; G06F 11/1004; H03M 13/098
  See application file for complete search history.

(56) References Cited

U.S. PATENT DOCUMENTS

| | | | | | |
|---|---|---|---|---|---|
| 5,577,199 | A | * | 11/1996 | Tanabe | G06F 11/185 714/37 |
| 5,910,895 | A | * | 6/1999 | Proskauer | G01R 31/31912 700/121 |
| 7,129,975 | B2 | * | 10/2006 | Levine | H04N 5/2176 348/246 |
| 8,359,521 | B2 | * | 1/2013 | Kim | G06F 11/1004 714/758 |
| 9,201,726 | B2 | * | 12/2015 | Morris | G06F 11/0793 |
| 9,268,637 | B2 | * | 2/2016 | Gifford | G06F 11/106 |
| 9,564,765 | B2 | * | 2/2017 | Fukute | H02J 7/0063 |
| 9,804,914 | B2 | * | 10/2017 | Kim | G11C 29/025 |
| 9,940,033 | B1 | * | 4/2018 | Alshawabkeh | G06F 3/0685 |

* cited by examiner

*Primary Examiner* — Esaw T Abraham
(74) *Attorney, Agent, or Firm* — ScienBiziP, P.C.

(57) ABSTRACT

A device using parity for verification of data transmitted from a first device through a data line to a second device includes a processor and a memory. The data line includes first to fourth pins for transmitting data and fifth to eighth pins for transmitting parity information. The processor receives values of first to eighth pins, calculates sum of the values of combinations of the first to fourth pins for data and applies modular operations on results of the four combinations. Equality or non-equality with the parity values of the fifth to eighth pins is determined, and the second device is permitted to receive the data when the results correspond, the modular operation being a (mod 2) operation. A method applied to such device is also disclosed.

10 Claims, 4 Drawing Sheets

DEVICE FOR VERIFYING DATA TRANSMISSIONS AND METHOD USING THE SAME

FIELD

The subject matter herein generally relates to data transmission, and more particularly to a data transmission parity device and a method for verifying data transmitted from one electronic device to another electronic device.

BACKGROUND

Data transmitted from one device to another device can be verified by verifying a parity bit in the data. Verification by reference to the parity bit may be erroneous.

Therefore, there is room for improvement within the art.

BRIEF DESCRIPTION OF THE DRAWINGS

Implementations of the present disclosure will now be described, by way of example only, with reference to the attached figures.

DETAILED DESCRIPTION

Figure 1:
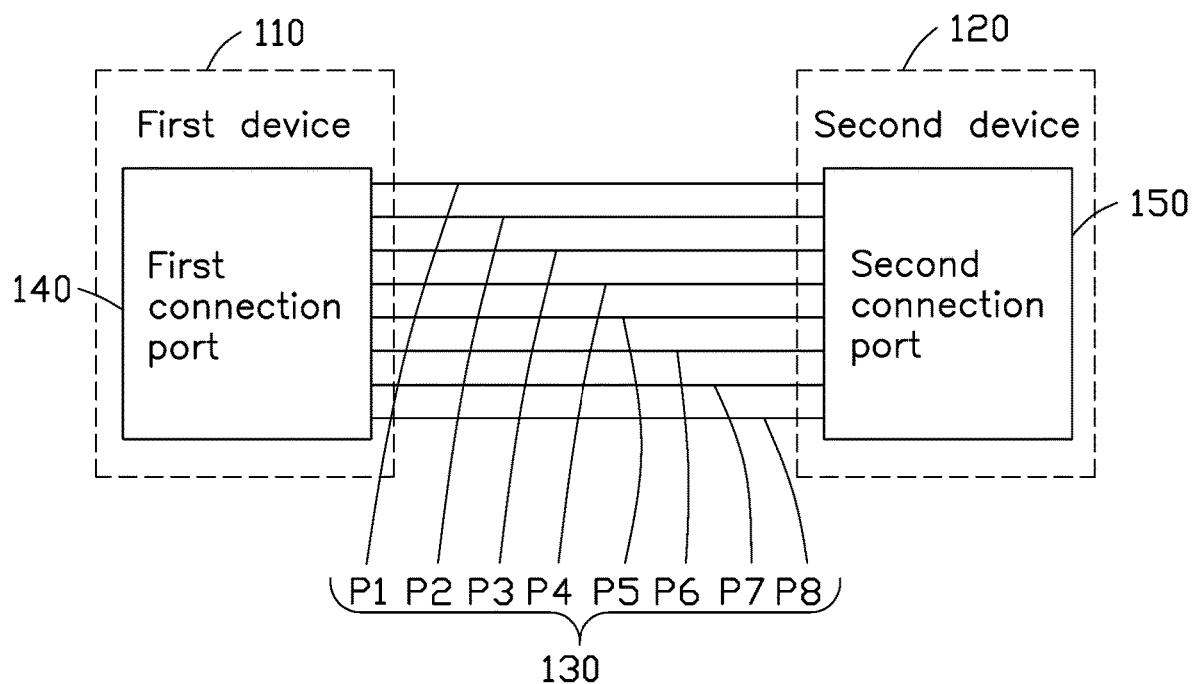
FIG. 1 is a block diagram of a first device coupled to a second device by a data line in accordance with an embodiment of the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

In general, the word "module" as used hereinafter refers to logic embodied in hardware or firmware, or to a collection of software instructions, written in a programming language such as, for example, Java, C, or assembly. One or more software instructions in the modules may be embedded in firmware such as in an erasable-programmable read-only memory (EPROM). It will be appreciated that the modules may comprise connected logic units, such as gates and flip-flops, and may comprise programmable units, such as programmable gate arrays or processors. The modules described herein may be implemented as either software and/or hardware modules and may be stored in any type of computer-readable medium or other computer storage device.

Figure 2:
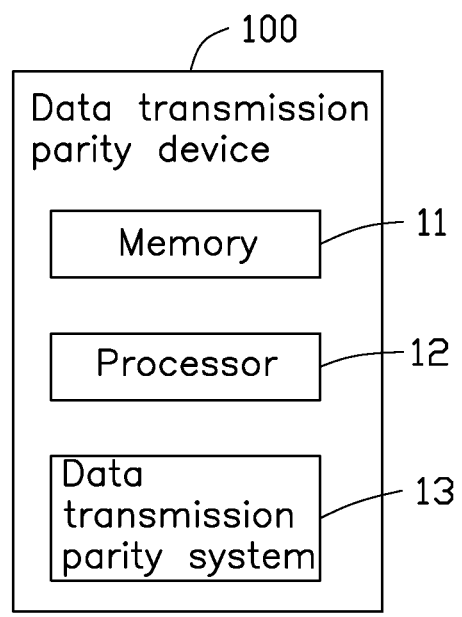
FIG. 2 is a block diagram of a data transmission device utilizing parity.
Figure 3:
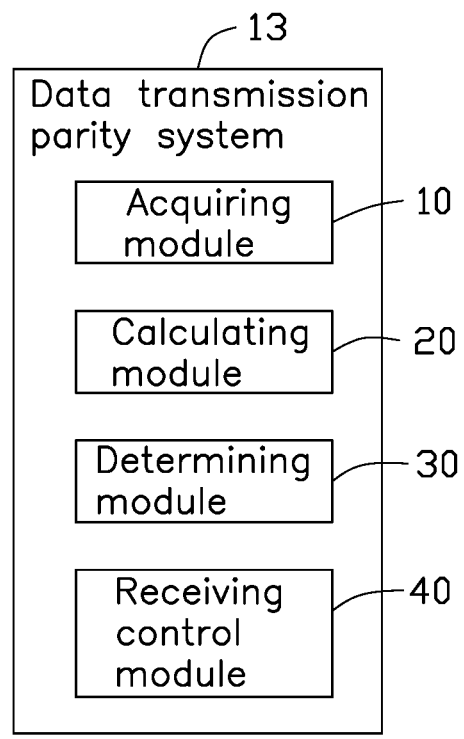
FIG. 3 is a block diagram of a system for data transmission utilizing parity implemented in the data transmission parity device.

FIGS. 1-3 illustrate an embodiment of a device for data transmission using parity (hereinafter "the device 100") for verifying data transmitted from a first device 110 to a second device 120. The first device 110 transmits the data to the second device 120 through a data line 130. The data line 130 includes first to fourth signal pins P1-P4.

For example, the first device 110 may be a rack management device, and the second device 120 may be a server. The first device 110 includes a first connection port 140. The second device 120 includes a second connection port 150. One end of the data line 130 is coupled to the first connection port 140, and the other end of the data line 130 is coupled to the second connection port 150 to transmit data from the first device 110 to the second device 120.

In at least one embodiment, the device 100 is installed within the second device 120 or is a standalone device. The data line 130 further includes fifth to eighth signal pins P5-P8 for transmitting parity information. In another embodiment, the device 100 is installed in the first device 110.

The device 100 includes a memory 11, a processor 12, and a system for data transmission using parity (hereinafter "system 13"). The system 13 may be divided into modules stored in the memory 11 and executed by the processor 12 for implementing functions of the system 13. Referring to FIG. 3, the modules of the data transmission parity system 13 may include an acquiring module 10, a calculating module 20, a determining module 30, and a receiving module 40.

In at least one embodiment, the memory 11 may include at least one of a read-only memory, a random access memory, a programmable read-only memory, an erasable programmable read-only memory, a one-time programmable read-only memory, an electrically-erasable programmable read-only memory, an electrically-erasable programmable read-only memory, a compact disc read-only memory, or other optical storage disk, magnetic storage disc, or magnetic storage tape. The processor 12 can be a central processing unit, a micro-processing unit, or other data processing chip.

The acquiring module 10 receives and acquires signal values of the first to the eighth signal pins P1-P8.

In at least one embodiment, the signal value is a binary number. The signal value of each of the signal pins is represented by logic 1 or logic 0. The fifth to eighth signal pins P5-P8 are all parity bits. The values of the fifth to the eighth signal pins P5-P8 are set according to requirements. The values of the fifth to the eighth signal pins P5-P8 can be set as logic 1 or logic 0.

The calculating module 20 can define any three signal pins of the first to the fourth signal pins P1-P4 as a first, a second, a third, and a fourth pin combination.

For example, the calculating module 20 can define the first signal pin P1, the second signal pin P2, and the third signal pin P3 as the first pin combination. The calculating module 20 can define the first signal pin P1, the second signal pin P2, and the fourth signal pin P4 as the second pin combination. The calculating module 20 can define the first signal pin P1, the third signal pin P3, and the fourth signal pin P4 as the third pin combination. The calculating module 20 can define the second signal pin P2, the third signal pin P3, and the fourth signal pin P4 as the fourth pin combination.

The calculating module 20 calculates sums of the signal values of the first, the second, the third, or the fourth pin combination and applies modular operations on the sum.

For example, the calculating module 20 calculates the sum of the signal values of the first pin combination and applies the modular operation on the sum to obtain the first modulo operation result. The calculating module 20 calculates the sum of the signal values of the second pin combination and applies the modular operation on the sum to obtain the second modulo operation result. The calculating module 20 calculates the sum of the signal values of the third pin combination and applies the modular operation on the sum to obtain the third modulo operation result. The calculating module 20 calculates the sum of the signal values of the fourth pin combination and applies the modular operation on the sum to obtain the fourth modulo operation result.

In at least one embodiment, the first modular operation is a modular 2 operation (mod 2). For example, if first pin combination is defined and signals of the first to the fourth signal pins P1-P4 are "1110" then the sum of the signal values of the first pin combination is represented by 1+1+1=3. The result (C1 result) of the calculating module 20 applying the modular operation on the sum is represented by (1+1+1)(mod 2)=1. If second pin combination is defined, the sum of the signal values is represented by 1+1+0=2, then the C2 result of the calculating module 20 applying the modular operation mod 2 on the sum is represented by (1+1+0)(mod 2)=0. If the third pin combination is defined, the sum of the signal values is represented by 1+1+0=2, then the C3 result of the calculating module 20 applying the modular operation mod 2 on the sum is represented by (1+1+0)(mod 2)=0. If the fourth pin combination is defined, the sum of the signal values is represented by 1+1+0=2, and then the C4 result of the calculating module 20 applying the modular operation mod 2 on the sum is represented by (1+1+0)(mod 2)=0.

The determining module 30 determines whether the C1 to the C4 results correspond to the values of the fifth to the eighth signal pins P5-P8.

The receiving control module 40 controls the second device 120 to receive the data transmitted from the first device 110 when the C1 to the C4 results correspond to the values of the fifth to the eighth signal pins P5-P8.

For example, if the data transmitted by the first device 110 through the first to the eighth signal pins P1-P8 are "11111111", the parity bits (on the fifth to the eighth signal pins P5-P8) is "1111." The data received by the second device 120 are "11111111", then the C1 result is represented by (1+1+1)(mod 2)=1, the C2 result is represented by (1+1+1)(mod 2)=1, the C3 result is represented by (1+1+1)(mod 2)=1, and the C4 result is represented by (1+1+1)(mod 2)=1. Since the C1 to the C4 results=correspond to the signal values of the fifth to the eighth pins P5~P8, the receiving control module 40 controls the second device 120 to receive the data "11111111".

The determining module 30 determines that a pin has a failure in the first to the fourth signal pins P1-P4 when at least one of the C1 to the C4 results is not equal to one of the signal values of the corresponding fifth to eighth signal pins P5-P8.

The receiving control module 40 repairs the failed pin and controls the second device 120 to receive data transmitted from the first device 110.

When three of the C1-C4 results are not equal to the signal values of the corresponding fifth to eighth signal pins P5-P8, the determining module 30 determines that there is a failed pin in the first to fourth signal pins P1-P4.

For example, if the data transmitted by the first device 110 through the first to eighth signal pins P1-P8 are "11111111", and the data received by the second device 120 are "10111111", then the C1 result is represented by (1+0+1)(mod 2)=0, the C2 result is represented by (1+0+1)(mod 2)=0, the C3 result is represented by (1+1+1)(mod 2)=1, and the C4 result is represented by (0+1+1)(mod 2)=0.

Since the C1 result is not equal to the signal value of the fifth signal pin P5, and then there is a failed pin in the first pin combination. The C2 result is not equal to the signal value of the sixth signal pin P6, and then there is a failed pin in the second pin combination. The C4 result is not equal to the signal value of the eighth signal pin P8, and then there is a failed pin in the fourth pin combination. The C3 result is equal to the signal value of the seventh signal pin P7, and then all the signal pins P1-P4 are normal or there are two failed pins in the fourth pin combination.

If the third pin combination (the first signal pin P1, the third signal pin P3, and the fourth signal pin P4) are all normal, and there is a failed pin in the first pin combination (the first signal pin P1, the second signal pin P2, and the third signal pin P3). There is a failed pin in the second pin combination (the first signal pin P1, the second signal pin P2, and the fourth signal pin P4), and there is a failed pin in the fourth pin combination (the second signal pin P2, the third signal pin P3, and the fourth signal pin P4).

Therefore, the determining module 30 can determine that the second signal pin P2 is the failed pin. The receiving control module 40 repairs the second signal pin P2 and controls the second device 120 to receive data transmitted from the first device 110.

When two of the C1-C4 results are not equal to the signal values of the corresponding fifth to eighth signal pins P5-P8, the determining module 30 determines that there are two failed pins in the first to the fourth signal pins P1-P4.

For example, if the data transmitted by the first device 110 through the first to the eighth signal pins P1-P8 are "11111111", and the data received by the second device 120 are "10011111", then the C1 result is represented by (1+0+0)(mod 2)=1, the C2 result is represented by (1+0+1)(mod 2)=0, the C3 result is represented by (1+0+1)(mod 2)=0, and the C4 result is represented by (0+0+1)(mod 2)=1.

Since the C1 result is equal to the signal value of the fifth signal pin P5, all of the single pins are normal or there are two failed pins in the first pin combination. The C2 result is not equal to the signal value of the sixth signal pin P6, thus there is a failed pin in the second pin combination. The C3 result is not equal to the signal value of the seventh signal pin P7, and there is failed pin in the third pin combination. The C4 result is equal to the signal value of the eighth signal pin P8, thus all of the signal pins are normal or there are two failed pins in the fourth pin combination.

If the first pin combination (the first signal pin P1, second signal pin P2, and the third signal pin P3) and the fourth pin combination (the second signal pin P2, the third signal pin P3, and the fourth signal pin P4) have all pins normal, since the first to the fourth signal pins P1 to P4 are not all normal pins, it can be determined that there are two failed pins in the first pin combination and the fourth pin combination.

Since there is a failed pin in both the second pin combination and the third pin combination, the first pin combination is compared with the second pin combination and the third pin combination to establish that the fourth signal pin P4 is the normal pin. The fourth pin combination is compared with the second pin combination and the third pin combination to establish that the first signal pin P1 is the normal pin.

Therefore, the determining module 30 can determine that the second signal pin P2 and the third signal pin P3 are failed pins. The receiving control module 40 repairs the second signal pin P2 and the third signal pin P3 and controls the second device 120 to receive data transmitted from the first device 110.

When one of the C1-C4 results are not equal to the signal values of the corresponding fifth to eighth signal pins P5-P8, the determining module 30 determines that there are three failed pins in the first to the fourth signal pins P1-P4.

For example, if the data transmitted by the first device 110 through the first to eighth signal pins P1-P8 are "11111111", and the data received by the second device 120 are "10001111", then the C1 result is represented by (1+0+0) (mod 2)=1, the C2 result is represented by (1+0+0)(mod 2)=1, the C3 result is represented by (1+0+0)(mod 2)=1, and the C4 result is represented by (0+0+0)(mod 2)=0.

Since the C1 result is equal to the signal value of the fifth signal pin P5, then all pins are normal or there are two failed pins in the first pin combination. The C2 result is equal to the signal value of the sixth signal pin P6, thus all pins are normal or there are two failed pins in the second pin combination. The C3 result is equal to the signal value of the seventh signal pin P7, thus all pins are normal or there are two failed pins in the third pin combination. The C4 result is equal to the signal value of the eighth signal pin P8, thus there is a failed pin in the fourth pin combination.

Since not all of the first to the fourth signal pins P1-P4 are normal, it can be determined that there are two failed pins in the first pin combination, the second pin combination, and the third pin combination.

The fourth pin combination is compared with the first pin combination, the second pin combination, and the third pin combination to establish that the first signal pin P1 is normal.

Therefore, the determining module 30 can determine that the second signal pin P2, the third signal pin P3, and the fourth signal pin P4 are failed pins. The receiving control module 40 repairs the second signal pin P2, the third signal pin P3, and the fourth signal pin P4 and controls the second device 120 to receive data transmitted from the first device 110.

When the C1-C4 results are not equal to the signal values of the corresponding fifth to eighth signal pins P5-P8, the determining module 30 determines that there are four pins in failure in the first to fourth signal pins P1-P4.

For example, if the data transmitted by the first device 110 through the first to eighth signal pins P1-P8 are "11111111", and the data received by the second device 120 are "00001111", then the C1 result is represented by (0+0+0) (mod 2)=0, the C2 result is represented by (0+0+0)(mod 2)=0, the C3 result is represented by (0+0+0)(mod 2)=0, and the C4 result is represented by (0+0+0)(mod 2)=0.

Since the C1 result is not equal to the signal value of the fifth signal pin P5, then there is a failed pin in the first pin combination. The C2 result is not equal to the signal value of the sixth signal pin P6, thus there is a failed pin in the second pin combination. The C3 result is not equal to the signal value of the seventh signal pin P7, thus there is a failed pin in the third pin combination. The C4 result is not equal to the signal value of the eighth signal pin P8, thus there is a failed pin in the fourth pin combination.

Therefore, the determining module 30 can determine that the first signal pin P1, the second signal pin P2, the third signal pin P3, and the fourth signal pin P4 are failed pins. The receiving control module 40 repairs the first signal pin P1, the second signal pin P2, the third signal pin P3, and the fourth signal pin P4 and controls the second device 120 to receive data transmitted from the first device 110.

In at least one embodiment, the receiving control module 40 controls the second device 120 to reject the data transmitted from the first device 110 when at least one of the C1-C4 results is not respectively equal to the signal values of the fifth to the eighth signal pins P5-P8.

In at least one embodiment, the data line 130 is a CAT5 cable. The CAT5 cable includes eight data lines.

Figure 4:
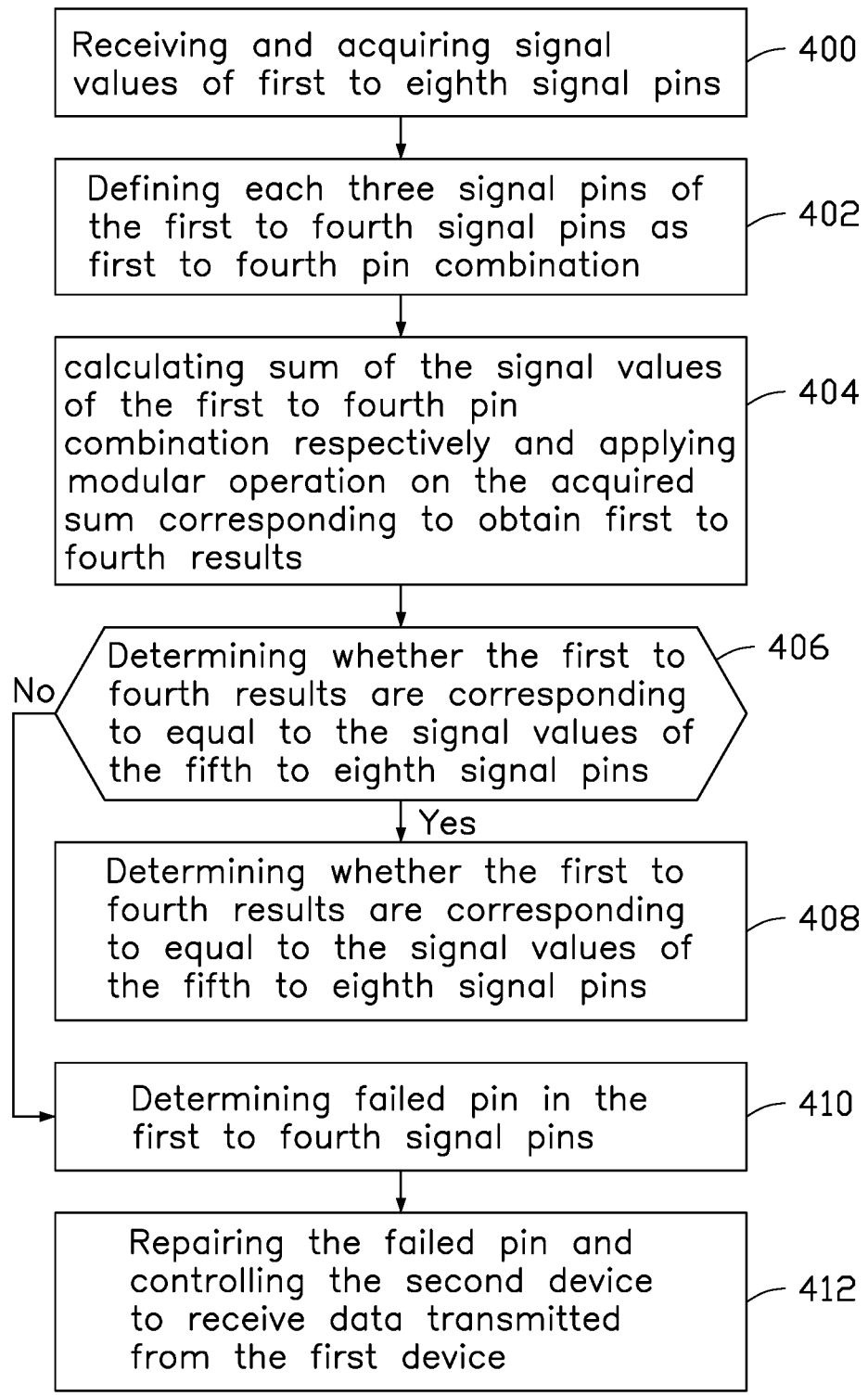
FIG. 4 is a flowchart of a data transmission method utilizing parity.

FIG. 4 illustrates a flowchart of a data transmission parity method for verifying data transmitted from a first device through a data line to a second device. The method is provided by way of example, as there are a variety of ways to carry out the method. The method described below can be carried out using the configurations illustrated in FIGS. 1-3, for example, and various elements of these figures are referenced in explaining the example method. Each block shown in FIG. 4 represents one or more processes, methods, or subroutines carried out in the example method. Furthermore, the illustrated order of blocks is by example only, and the order of the blocks can be changed. Additional blocks can be added or fewer blocks can be utilized, without departing from this disclosure. The example method can begin at block 400.

At block 400, the acquiring module 10 receives and obtains signal values of a first to a eighth signal pins P1-P8.

At block 402, the calculating module 20 defines any three signal pins of the first to the fourth signal pins P1-P4 as a first, a second, a third, and a fourth pin combination.

At block 404, the calculating module 20 calculates sums of the signal values of the first, the second, the third, or the fourth pin combination and applies modular operations on the calculated sum.

At block 406, the determining module 30 determines whether the first to the fourth results are correspondingly equal to the signal values of the fifth to the eighth signal pins P5-P8. If the first to the fourth results are correspondingly equal to the signal values of the fifth to the eighth signal pins P5-P8, the block 408 is implemented, otherwise, the block 410 is implemented.

At block 408, the receiving control module 40 controls the second device 120 to receive the data transmitted from the first device 110.

At block 410, the determining module 30 determines there are at least one failed pin in the first to the fourth signal pins P1-P4.

At block 412, the receiving control module 40 repairs the failed pin and controls the second device 120 to receive data transmitted from the first device 110.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A data transmission parity method for verifying data transmitted from a first device through a data line to a second device, the data line comprising a first to a fourth signal pins for transmitting data, the data line further comprising a fifth to an eighth signal pins for transmitting parity information, the method comprising:

receiving and acquiring signal values of the first to the eighth signal pins, and defining each three signal pins of the first to the fourth signal pins as a first to a fourth pin combination;

calculating a sum of the signal values of each of the first to the fourth pin combination, and respectively executing a modular operation on each of the sum to obtain a first to a fourth results;

determining whether the first to the fourth results are correspondingly equal to the signal values of the fifth to the eighth signal pins; and controlling the second device to receive the data when the first to the fourth results are correspondingly equal to the signal values of the fifth to the eighth signal pins.

2. The data transmission parity method of claim 1, further comprising:

controlling the second device to reject the data when at least one of the first to the fourth results is not correspondingly equal to one of the signal values of the fifth to the eighth signal pins.

3. The data transmission parity method of claim 1, further comprising:

determining failed pins in the first to the fourth signal pins when at least one of the first to the fourth results is not correspondingly equal to one of the signal values of the fifth to the eighth signal pins; and repairing the failed pins and controlling the second device to receive the data.

4. The data transmission parity method of claim 1, wherein the data line is a CAT5 cable.

5. A data transmission parity device for verifying data transmitted from a first device through a data line to a second device, the data line comprising a first to a fourth signal pins for transmitting data, the data line further comprising a fifth to an eighth signal pins for transmitting parity information, the data transmission parity device comprising:

a processor; and a memory storing a plurality of instructions, which when executed by the processor, cause the processor to:

receive and obtain signal values of the first to the eighth signal pins, and define each three signal pins of the first to the fourth signal pins as a first to a fourth pin combination;

calculate a sum of the signal values of the first to the fourth pin combination and respectively apply a modular operation on each of the sum to obtain a first to a fourth results;

determine whether the first to the fourth results are correspondingly equal to the signal values of the fifth to the eighth signal pins; and control the second device to receive the data when the first to the fourth results are correspondingly equal to the signal values of the fifth to the eighth signal pins.

6. The data transmission parity device of claim 5, further comprising:

controlling the second device to reject the data when at least one of the first to the fourth results is not correspondingly equal to one of the signal values of the fifth to the eighth signal pins.

7. The data transmission parity device of claim 5, further comprising:

determining failed pins in the first to the fourth signal pins when at least one of the first to the fourth results is not correspondingly equal to one of the signal values of the fifth to the eighth signal pins; and repairing the failed pins and controlling the second device to receive the data.

8. The data transmission parity device of claim 5, wherein the data line is a CAT5 cable.

9. A data transmission parity device for verifying data transmitted from a first device through a data line to a second device, the data line comprising a first to a fourth signal pins for transmitting data, the data line further comprising a fifth to an eighth signal pins for transmitting parity information, the data transmission parity device comprising:

a processor; and a memory storing a plurality of instructions, which when executed by the processor, cause the processor to:

receive and obtain signal values of the first to the eighth signal pins, and define each three signal pins of the first to the fourth signal pins as a first to a fourth pin combination;

calculate a sum of the signal values of the first to the fourth pin combination and respectively apply a modular operation on each of the sum to obtain a first to a fourth results;

determine whether the first to the fourth results are correspondingly equal to the signal values of the fifth to the eighth signal pins;

control the second device to receive the data when the first to the fourth results are correspondingly equal to the signal values of the fifth to the eighth signal pins;

determine failed pins in the first to the fourth signal pins when at least one of the first to the fourth results is not correspondingly equal to one of the signal values of the fifth to the eighth signal pins; and repair the failed pins and control the second device to receive the data.

10. The data transmission parity device of claim 9, wherein the data line is a CAT5 cable.

* * * * *